(12) United States Patent
Tanaka et al.

(10) Patent No.: US 10,038,070 B2
(45) Date of Patent: Jul. 31, 2018

(54) NITRIDE SEMICONDUCTOR DEVICE

(71) Applicant: ROHM CO., LTD.

(72) Inventors: Taketoshi Tanaka, Kyoto (JP); Minoru Akutsu, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/232,305

(22) Filed: Aug. 9, 2016

(65) Prior Publication Data

US 2017/0047412 A1    Feb. 16, 2017

(30) Foreign Application Priority Data

Aug. 10, 2015    (JP) ................. 2015-158429

(51) Int. Cl.
| | |
|---|---|
| *H01L 29/778* | (2006.01) |
| *H01L 29/207* | (2006.01) |
| *H01L 29/423* | (2006.01) |
| *H01L 29/66* | (2006.01) |
| *H01L 23/00* | (2006.01) |
| *H01L 29/20* | (2006.01) |

(52) U.S. Cl.
CPC .......... *H01L 29/4236* (2013.01); *H01L 24/48* (2013.01); *H01L 24/73* (2013.01); *H01L 29/207* (2013.01); *H01L 29/66462* (2013.01); *H01L 29/7783* (2013.01); *H01L 29/7786* (2013.01); *H01L 29/2003* (2013.01); *H01L 2224/48257* (2013.01); *H01L 2224/73265* (2013.01)

(58) Field of Classification Search
CPC .......... H01L 29/4236; H01L 29/42372; H01L 29/42376; H01L 29/4238; H01L 29/7783; H01L 29/7785; H01L 29/7784; H01L 29/2003; H01L 29/201; H01L 29/207; H01L 29/66462; H01L 29/402; H01L 2224/73265; H01L 2224/48257; H01L 24/73; H01L 24/48
See application file for complete search history.

(56) References Cited

U.S. PATENT DOCUMENTS

| | | | | |
|---|---|---|---|---|
| 4,158,851 A | * | 6/1979 | Akai ................. | H01L 29/207 148/33 |
| 7,018,597 B2 | * | 3/2006 | Ellison ............. | C30B 25/00 117/103 |
| 8,674,407 B2 | * | 3/2014 | Ando ............... | H01L 29/4236 257/190 |

(Continued)

FOREIGN PATENT DOCUMENTS

JP    5064824 B2    10/2012

*Primary Examiner* — Michael Trinh
(74) *Attorney, Agent, or Firm* — Rabin & Berdo, P.C.

(57) ABSTRACT

A nitride semiconductor device according to the present invention includes a nitride semiconductor layer including an electron transit layer and an electron supply layer which is in contact with the electron transit layer and which has a composition different from that of the electron transit layer, a gate electrode on the nitride semiconductor layer and a gate insulating film between the gate electrode and the nitride semiconductor layer. A region whose depth is 250 nm from an interface between the gate insulating film and the gate electrode includes a region which has a deep acceptor concentration equal to or more than $1.0 \times 10^{16}$ cm$^{-3}$.

25 Claims, 12 Drawing Sheets

(56) References Cited

U.S. PATENT DOCUMENTS

| | | | | |
|---|---|---|---|---|
| 2014/0008661 A1* | 1/2014 | Iwami | ............... | H01L 29/2003 |
| | | | | 257/76 |
| 2014/0015608 A1* | 1/2014 | Kotani | ............... | H01L 29/2003 |
| | | | | 330/277 |
| 2014/0291775 A1* | 10/2014 | Oka | ............... | H01L 29/518 |
| | | | | 257/411 |
| 2014/0377911 A1* | 12/2014 | Wu | ............... | H01L 23/057 |
| | | | | 438/122 |
| 2015/0173248 A1* | 6/2015 | Zeng | ............... | H05K 7/1432 |
| | | | | 361/709 |
| 2016/0315180 A1* | 10/2016 | Tanaka | ............... | H01L 29/207 |
| 2017/0025328 A1* | 1/2017 | Liu | ............... | H01L 29/2003 |
| 2017/0047410 A1* | 2/2017 | Tanaka | ............... | H01L 29/41775 |

* cited by examiner

FIG. 3A  At time of no bias
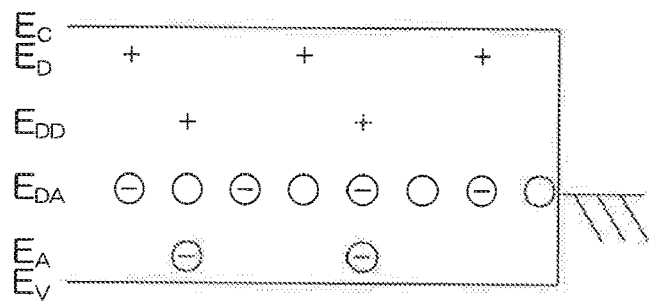
FIG. 3B  Application of bias
(state where no current flows)
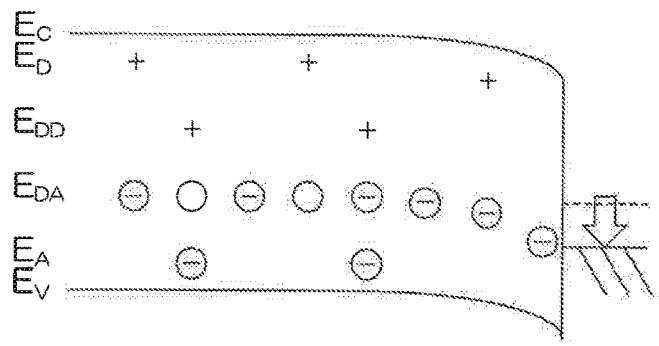
FIG. 3C  Application of bias
(state where current starts to flow)
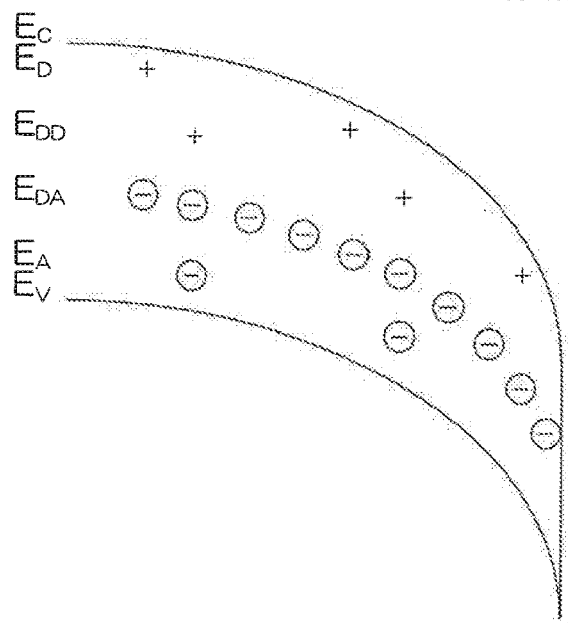

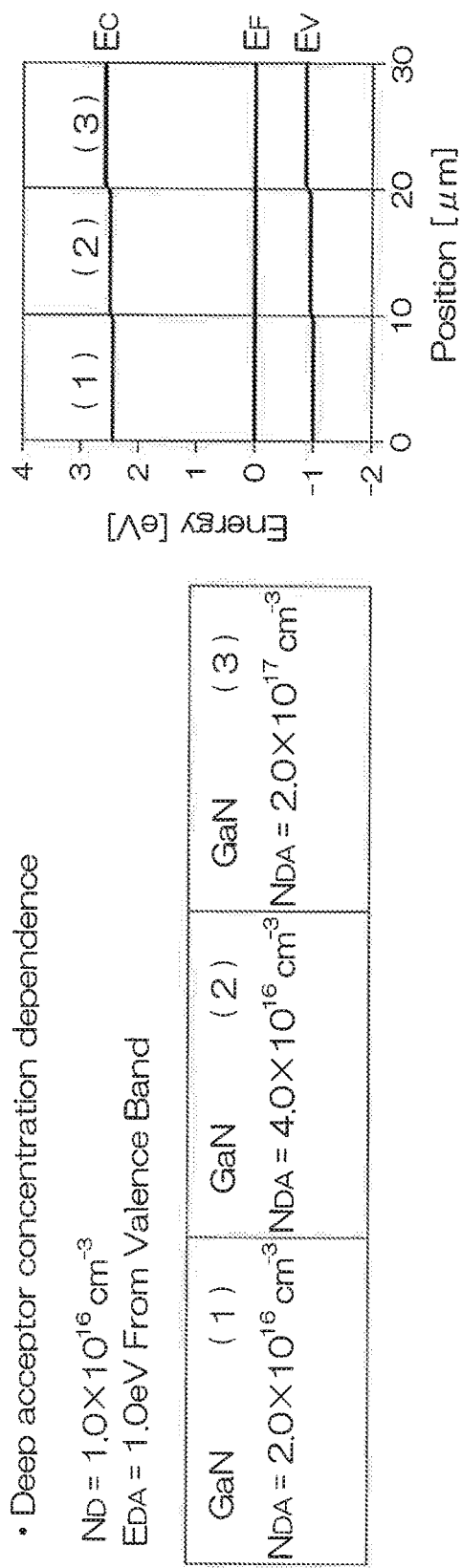

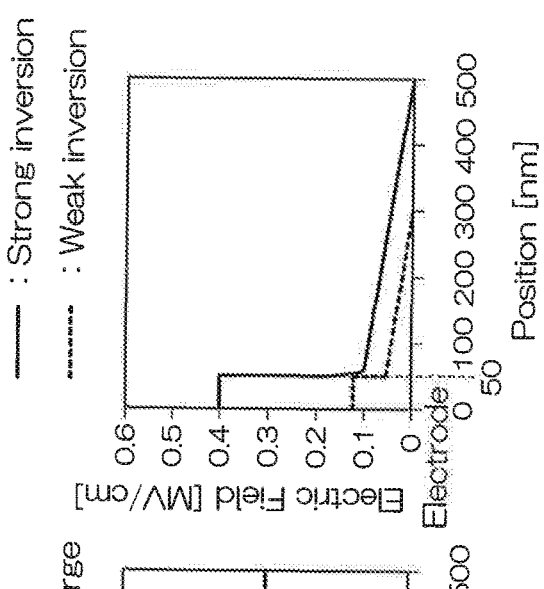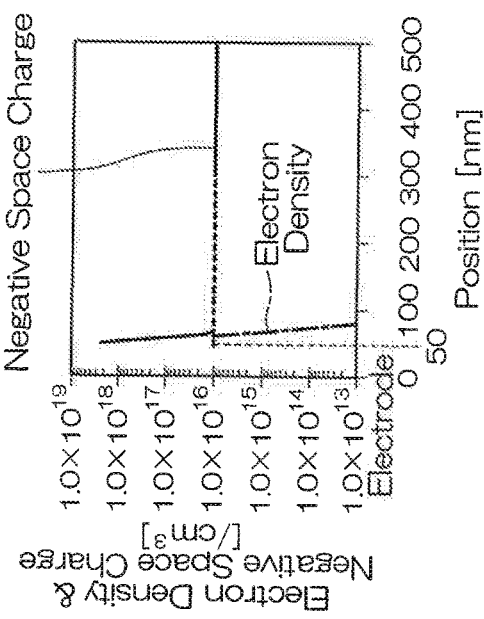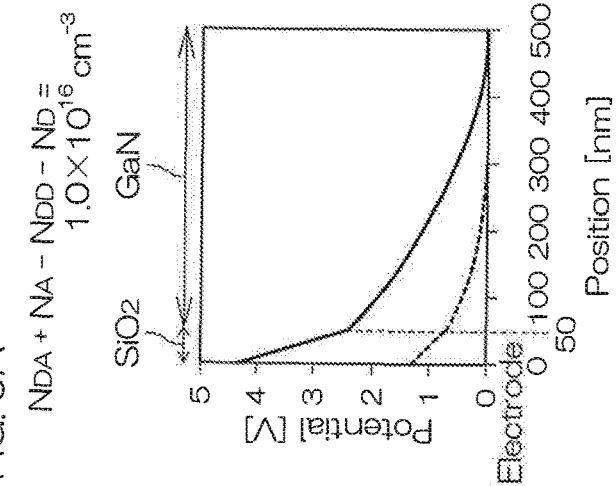

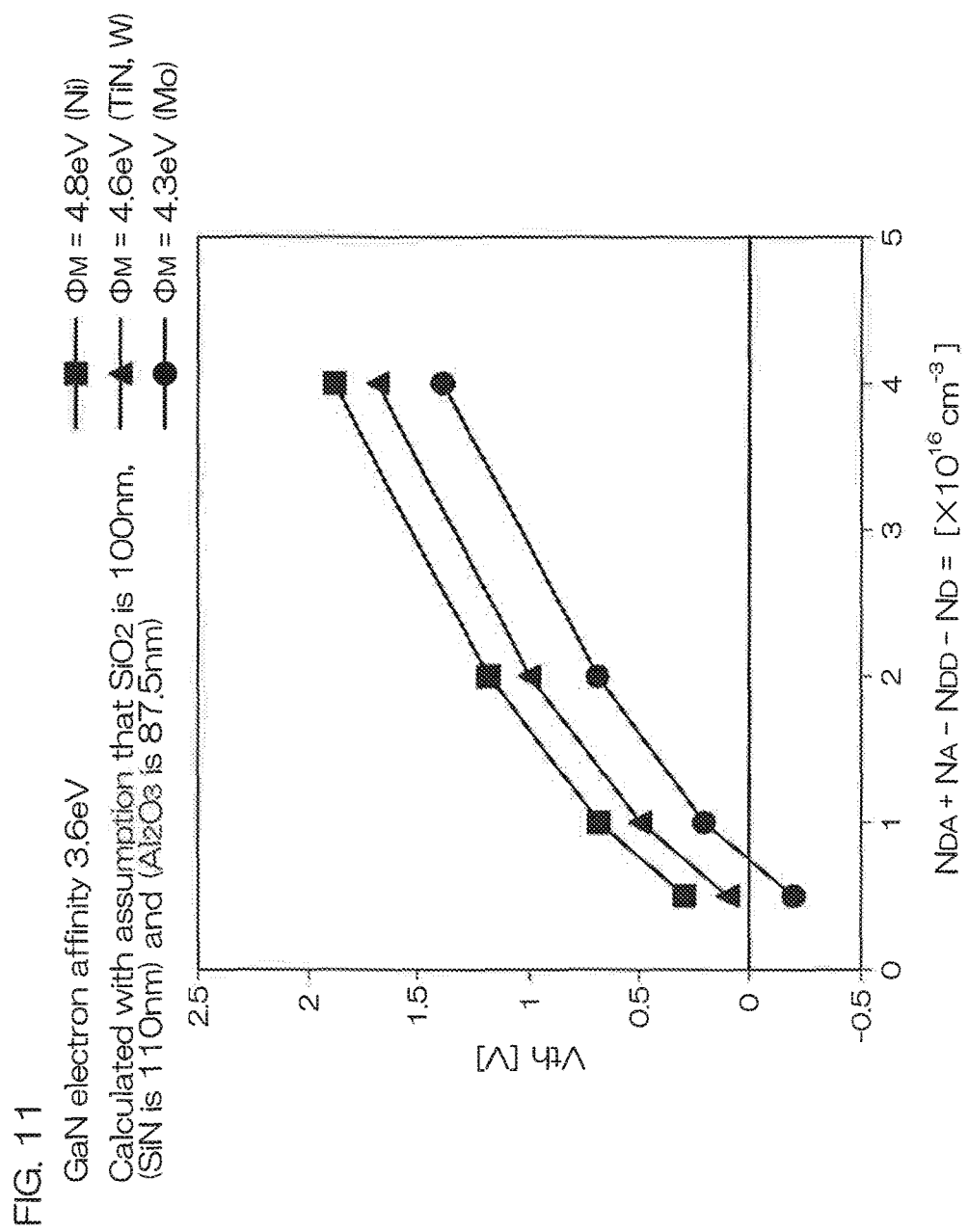

NITRIDE SEMICONDUCTOR DEVICE

CROSS-REFERENCE TO RELATED APPLICATIONS

The present application corresponds to patent application No. 2015-158429 filed in the Japan Patent Office on Aug. 10, 2015, and the entire disclosure of which is incorporated herein by reference.

TECHNICAL FIELD

The present invention relates to nitride semiconductor devices.

BACKGROUND ART

For example, Patent Document 1 (Japanese Patent No. 5064824) discloses a HEMT. The HEMT has a heterojunction structure which is formed by stacking, on a substrate, a low-temperature buffer layer formed of GaN, a buffer layer formed of GaN, an electron transit layer formed of GaN and an electron supply layer formed of AlGaN in this order. The HEMT has a source electrode, a gate electrode and a drain electrode on the electron supply layer.

In the HEMT, the electron supply layer has a band-gap energy larger than the electron transit layer, and a two-dimensional electron gas layer is formed under a heterojunction interface of the two layers. The two-dimensional electron gas layer is utilized as a carrier. Specifically, when the source electrode and the drain electrode are operated, electrons supplied to the electron transit layer travel at a high speed in the two-dimensional electron gas layer and are moved to the drain electrode. Here, a voltage applied to the gate is controlled to change the thickness of a depletion layer under the gate electrode, and thus it is possible to control the electrons moved from the source electrode to the drain electrode, that is, a drain current.

SUMMARY OF INVENTION

Among these types of HEMTs, there is a HEMT called a normally-off type. When the normally-off type HEMT is interpreted literally, it is a device in which when the gate application voltage Vg=0V, no drain current flows. However, even when the gate application voltage Vg=0V, a small drain current may flow or the normally-off type HEMT may be erroneously turned on. Hence, it is desired to develop a more complete normally-off type HEMT.

On the other hand, when a gate insulating film is increased in thickness, a gate threshold voltage Vth is increased and thus the problem described above may be solved. However, when the gate insulating film is increased in thickness, and thus a mutual conductance gm is lowered, with the result that the high-speed operation of the HEMT may be adversely affected.

In a preferred embodiment of the present invention, a nitride semiconductor device is provided which only slightly affects the high-speed operation and which can increase the gate threshold voltage Vth.

BRIEF DESCRIPTION OF DRAWINGS

FIGS. 3A to 3C are diagrams for illustrating a method of measuring $N_{DA}+N_A-N_{DD}-N_D$.

FIG. 6B is a diagram showing the dependence of the Fermi level $E_F$ of the semi-insulating GaN on a deep acceptor level $N_{DA}$.

FIGS. 9A to 9C are diagrams showing the simulation results when $N_{DA}+N_A-N_{DD}-N_D=1.0\times10^{16}$ cm$^{-3}$.

FIG. 11 is a graph showing a relationship between $N_{DA}+N_A-N_{DD}-N_D$ and a gate threshold voltage Vth.

DESCRIPTION OF EMBODIMENTS

Figure 1:
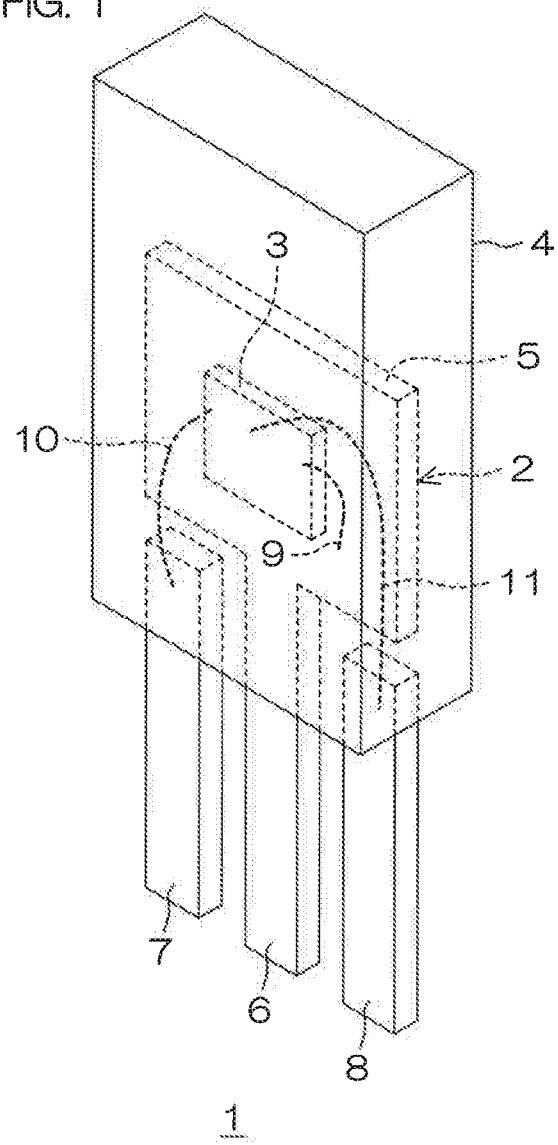
FIG. 1 is an external view of a semiconductor package which includes a nitride semiconductor device according to a preferred embodiment of the present invention.

A preferred embodiment of the present invention provides a nitride semiconductor device including a nitride semiconductor layer including an electron transit layer and an electron supply layer which is in contact with the electron transit layer and which has a composition different from a composition of the electron transit layer, a gate electrode on the nitride semiconductor layer and a gate insulating film between the gate electrode and the nitride semiconductor layer, where a region whose depth is 250 nm from an interface between the gate insulating film and the gate electrode includes a region which has a deep acceptor concentration equal to or more than $1.0\times10^{16}$ cm$^{-3}$.

A preferred embodiment of the present invention provides a nitride semiconductor device including a nitride semiconductor layer including an electron transit layer and an electron supply layer which is in contact with the electron transit layer and which has a composition different from a composition of the electron transit layer, a gate electrode on the nitride semiconductor layer and a gate insulating film between the gate electrode and the nitride semiconductor layer, where a region whose depth is 250 nm from an interface between the gate insulating film and the gate electrode includes a region which has a carbon concentration equal to or more than $1.0\times10^{16}$ cm$^{-3}$.

In the preferred embodiment of the present invention, the region whose depth is 250 nm may include a region in which a value of $N_{DA}+N_A-N_{DD}-N_D$ is equal to or more than $1.0\times10^{16}$ cm$^{-3}$, and $N_A$ represents a shallow acceptor concentration, $N_{DA}$ represents a deep acceptor concentration, $N_D$ represents a shallow donor concentration and $N_{DD}$ represents a deep donor concentration.

In the preferred embodiment of the present invention, the region whose depth is 250 nm may include a region in which a value of $N_{DA}-N_D-N_{DD}$ is equal to or more than $1.0\times10^{16}$ cm$^{-3}$, and $N_{DA}$ represents a deep acceptor concentration, $N_D$ represents a shallow donor concentration and $N_{DD}$ represents a deep donor concentration.

In the preferred embodiment of the present invention, a work function $\Phi_M$ of the gate electrode may be equal to or less than 5.0 eV.

In the preferred embodiment of the present invention, a relationship between a thickness d (nm) of the gate insulating film and a relative permittivity $\varepsilon$ of the gate insulating film may be d/$\varepsilon$≤25.

A preferred embodiment of the present invention provides a nitride semiconductor device including a nitride semiconductor layer including an electron transit layer and an electron supply layer which is in contact with the electron transit layer and which has a composition different from a composition of the electron transit layer, a gate electrode on the nitride semiconductor layer and a gate insulating film between the gate electrode and the nitride semiconductor layer, where a region whose depth is 150 nm from an interface between the gate insulating film and the gate electrode includes a region which has a deep acceptor concentration equal to or more than $3.0 \times 10^{16}$ cm$^{-3}$.

A preferred embodiment of the present invention provides a nitride semiconductor device including a nitride semiconductor layer including an electron transit layer and an electron supply layer which is in contact with the electron transit layer and which has a composition different from a composition of the electron transit layer, a gate electrode on the nitride semiconductor layer and a gate insulating film between the gate electrode and the nitride semiconductor layer, where a region whose depth is 150 nm from an interface between the gate insulating film and the gate electrode includes a region which has a carbon concentration equal to or more than $3.0 \times 10^{16}$ cm$^{-3}$.

In the preferred embodiment of the present invention, the region whose depth is 150 nm may include a region in which a value of $N_{DA}+N_A-N_{DD}-N_D$ is equal to or more than $3.0 \times 10^{16}$ cm$^{-3}$, and $N_A$ represents a shallow acceptor concentration, $N_{DA}$ represents a deep acceptor concentration, $N_D$ represents a shallow donor concentration and $N_{DD}$ represents a deep donor concentration.

In the preferred embodiment of the present invention, the region whose depth is 150 nm may include a region in which a value of $N_{DA}-N_D-N_{DD}$ is equal to or more than $3.0 \times 10^{16}$ cm$^{-3}$, and $N_{DA}$ represents a deep acceptor concentration, $N_D$ represents a shallow donor concentration and $N_{DD}$ represents a deep donor concentration.

In the preferred embodiment of the present invention, a work function $\Phi_M$ of the gate electrode may be equal to or less than 4.5 eV.

In the preferred embodiment of the present invention, a relationship between a thickness d (nm) of the gate insulating film and a relative permittivity $\varepsilon$ of the gate insulating film may be d/$\varepsilon$≤25.

In the preferred embodiment of the present invention, the deep acceptor concentration or the carbon concentration may be equal to or less than $5.0 \times 10^{16}$ cm$^{-3}$.

In the preferred embodiment of the present invention, the deep acceptor may include an energy level in a position 0.025 eV or more away from an energy level of an upper end of a valence band of the electron transit layer.

In the preferred embodiment of the present invention, the deep acceptor concentration may include a carbon concentration and a vacancy defect concentration of Ga atoms.

According to the preferred embodiment of the present invention, it is possible to provide a nitride semiconductor device which only slightly affects the high-speed operation and which can increase the gate threshold voltage Vth.

Preferred embodiments of the present invention will be described in detail below with reference to accompanying drawings.

FIG. 1 is an external view of a semiconductor package 1 which includes a nitride semiconductor device 3 according to a preferred embodiment of the present invention.

The semiconductor package 1 includes a terminal frame 2, the nitride semiconductor device 3 (chip) and a resin package 4.

The terminal frame 2 is made of a metal and is formed in the shape of a plate. The terminal frame 2 includes a base portion 5 (island) which supports the nitride semiconductor device 3, a drain terminal 6, a source terminal 7 and a gate terminal 8. The drain terminal 6 is formed integrally with the base portion 5. The drain terminal 6, the source terminal 7 and the gate terminal 8 are respectively electrically connected to the drain, the source and the gate of the nitride semiconductor device 3 via bonding wires 9 to 11. The source terminal 7 and the gate terminal 8 are arranged so as to sandwich the drain terminal 6 in the center.

The resin package 4 is formed of, for example, a known mold resin such as an epoxy resin, and seals the nitride semiconductor device 3. The resin package 4 covers the base portion 5 of the terminal frame 2 and the bonding wires 9 to 11 together with the nitride semiconductor device 3. Parts of the three terminals 6 to 8 are exposed from the resin package 4.

Figure 2:
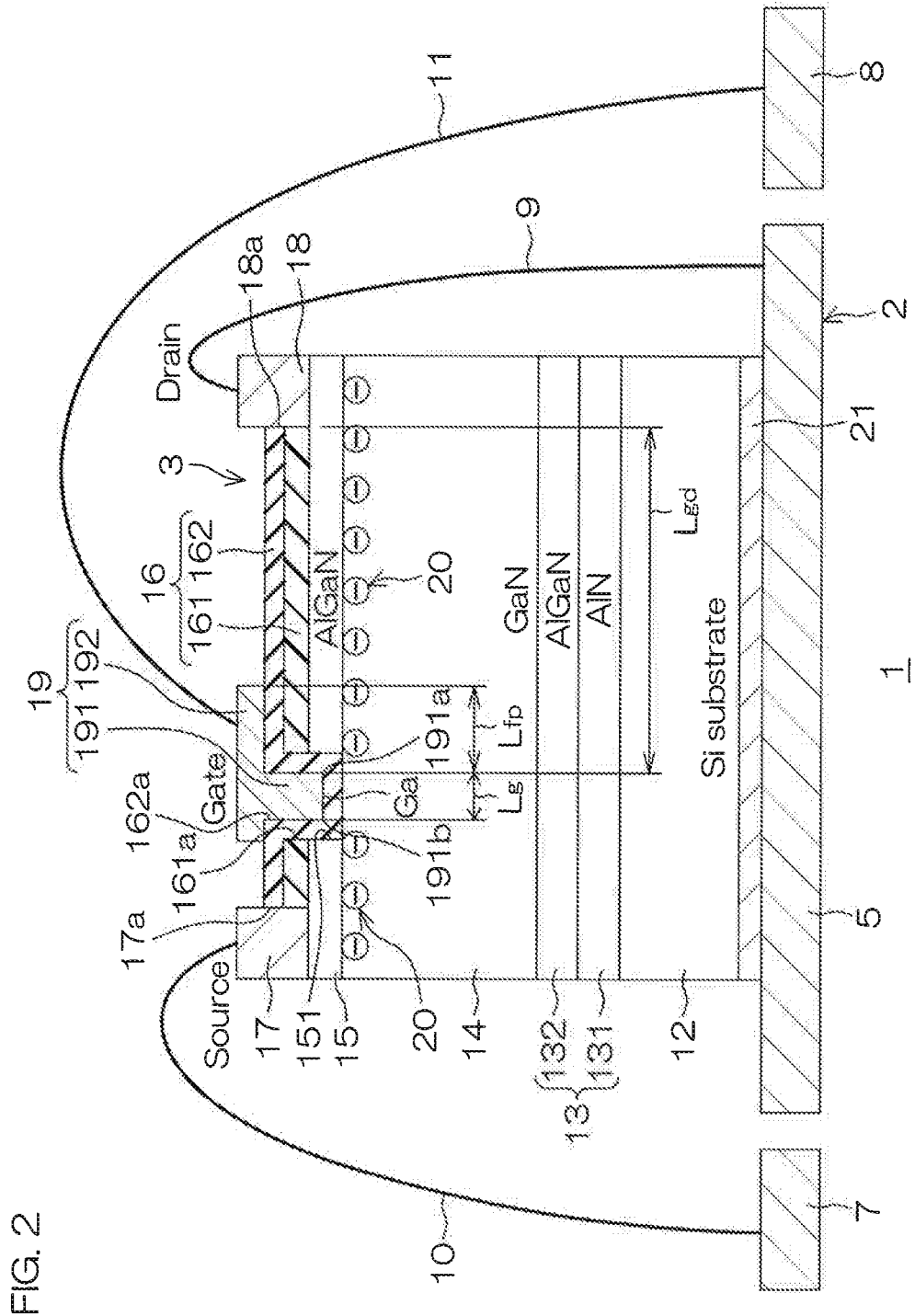
FIG. 2 is a schematic cross-sectional view of the nitride semiconductor device.

FIG. 2 is a schematic cross-sectional view of the nitride semiconductor device 3. FIG. 2 does not show a cross section taken in a specific position of FIG. 1 but shows a cross section of a collection of elements necessary for the description of the present preferred embodiment.

The nitride semiconductor device 3 includes a substrate 12, a buffer layer 13 which is formed on the surface of the substrate 12, an electron transit layer 14 which is epitaxially grown on the buffer layer 13 and an electron supply layer 15 which is epitaxially grown on the electron transit layer 14. The nitride semiconductor device 3 further includes a gate insulating film 16 which covers the surface of the electron supply layer 15 and a source electrode 17 and a drain electrode 18 which penetrate contact holes 17a and 18a formed in the gate insulating film 16 to make ohmic contact with the electron supply layer 15 and which serve as ohmic electrodes. The source electrode 17 and the drain electrode 18 are arranged with an interval, and a gate electrode 19 is arranged between them. The gate electrode 19 is opposite to the electron supply layer 15 via the gate insulating film 16.

The substrate 12 may be, for example, a conductive silicon substrate. The conductive silicon substrate may have, for example, an impurity concentration of $1.0 \times 10^{17}$ cm$^{-3}$ to $1.0 \times 10^{20}$ cm$^{-3}$ (more specifically, about $1.0 \times 10^{18}$ cm$^{-3}$).

The buffer layer 13 may be a multilayer buffer layer in which a first buffer layer 131 and a second buffer layer 132 are stacked. The first buffer layer 131 is in contact with the surface of the substrate 12, and the second buffer layer 132 is stacked on the surface of the first buffer layer 131 (the surface on the opposite side of the substrate 12). In the present preferred embodiment, the first buffer layer 131 is formed with an AlN film, and the thickness of the film may be, for example, about 0.2 μm. In the present preferred embodiment, the second buffer layer 132 is formed with an AlGaN film, and the thickness of the film may be, for example, about 0.2 μm.

The gate insulating film 16 covers the surface of the electron supply layer 15, and is also formed on the surface of the electron transit layer 14 which is exposed to an opening 151 selectively formed in part of the electron supply layer 15. The gate insulating film 16 may be a multilayer gate insulating film in which a first insulating layer 161 and a second insulating layer 162 are stacked. The first insulating layer 161 is in contact with the surface of the electron supply layer 15, and the second insulating layer 162 is stacked on the surface of the first insulating layer 161 (the surface on the opposite side of the electron supply layer 15). In the present preferred embodiment, the first insulating layer 161 is formed with an SiN film, and the thickness of the film may be, for example, about 500 angstroms. The first insulating layer 161 described above can be formed by a plasma CVD (chemical vapor deposition) method, a thermal CVD method, sputtering or the like. In the first insulating layer 161, an opening 161a is formed so as to be continuous to the opening 151 and through which the second insulating layer 162 is passed to make contact with the electron transit layer 14. In the present preferred embodiment, the second insulating layer 162 is formed with an $SiO_2$ film, and the thickness of the film may be equal to or less than 100 nm (preferably 10 to 50 nm). As with the first insulating layer 161, the second insulating layer 162 described above can be formed by a plasma CVD (chemical vapor deposition) method, a thermal CVD method, sputtering or the like.

In the gate insulating film 16, as a whole, a relationship between a thickness d (nm) and a relative permittivity ε is preferably d/ε≤25. The relationship is satisfied, and thus it is possible to achieve a high mutual conductance gm, with the result that the HEMT can be driven at a low gate voltage.

The electron transit layer 14 and the electron supply layer 15 are formed of group-III nitride semiconductors having different Al compositions (hereinafter simply referred to as "nitride semiconductors"). For example, the electron transit layer 14 may be formed with a GaN layer, and the thickness thereof may be about 0.5 μm. In the present preferred embodiment, the electron supply layer 15 is formed with an $Al_xGa_{1-x}N$ layer (0<x<1), and the thickness thereof is, for example, 5 nm to 30 nm (more specifically, about 20 nm).

As described above, the electron transit layer 14 and the electron supply layer 15 are formed of nitride semiconductors having different Al compositions to form a heterojunction, and a lattice mismatch occurs therebetween. Then, due to polarization caused by the heterojunction and the lattice mismatch, in a position close to an interface between the electron transit layer 14 and the electron supply layer (for example, a position of a distance of about a few angstroms from the interface), a two-dimensional electron gas 20 is spread.

In the electron transit layer 14, with respect to the energy band structure thereof, a shallow donor level $E_D$, a deep donor level $E_{DD}$, a shallow acceptor level $E_A$ and a deep acceptor level $E_{DA}$ may be formed.

The shallow donor level $E_D$ is, for example, an energy level in a position 0.025 eV or less away from an energy level $E_c$ of the lower end (bottom) of the conduction band of the electron transit layer 14, and may be simply referred to as a "donor level $E_D$" when it is possible to distinguish it from the deep donor level $E_{DD}$. In general, donor electrons with which this position is doped are free electrons even at room temperature (thermal energy kT=about 0.024 eV) because they are excited by the conduction band. As an impurity which dopes the GaN electron transit layer 14 to form the shallow donor level $E_D$, for example, at least one type selected from a group consisting of Si and O is present. On the other hand, the deep donor level $E_{DD}$ is, for example, an energy level in a position 0.025 eV or more away from the energy level $E_c$ of the lower end (bottom) of the conduction band of the electron transit layer 14. In other words, the deep donor level $E_{DD}$ is formed by doping with a donor in which ionization energy necessary for excitation is higher than thermal energy at room temperature. Hence, in general, donor electrons with which this position is doped are not excited by the conduction band at room temperature and are captured by the donor.

The shallow acceptor level $E_A$ is, for example, an energy level in a position 0.025 eV or less away from an energy level $E_V$ of the upper end (top) of the valence band of the electron transit layer 14, and may be simply referred to as an "acceptor level $E_A$" when it is possible to distinguish it from the deep acceptor level $E_{DA}$. In general, acceptor holes with which this position is doped are free holes even at room temperature (thermal energy kT=about 0.024 eV) because they are excited by the valence band. On the other hand, the deep acceptor level $E_{DA}$ is, for example, an energy level in a position 0.025 eV or more away from the energy level $E_V$ of the upper end (top) of the valence band of the electron transit layer 14. In other words, the deep acceptor level $E_{DA}$ is formed by doping with an acceptor in which ionization energy necessary for excitation is higher than thermal energy at room temperature. Hence, in general, acceptor holes with which this position is doped are not excited by the valence band at room temperature and are captured by the acceptor.

Examples of an impurity which dopes the electron transit layer 14 made of GaN so as to form the deep acceptor level $E_{DA}$ include at least one type selected from a group consisting of, for example, C, Be, Cd, Ca, Cu, Ag, Au, Sr, Ba, Li, Na, K, Sc, Zr, Fe, Co, Ni, Mg, Ar and He.

The impurity for the deep acceptor level $E_{DA}$ may be introduced, for example, in the process during which the electron transit layer 14 is epitaxially grown. In this case, the growth temperature and the growth pressure of a nitride semiconductor such as GaN are controlled, and thus it is possible to adjust the introduced amount. For example, when C (carbon) is introduced, the growth temperature and the growth pressure are lowered, and thus it is possible to increase the introduced amount. The vacancy defect of Ga atoms likewise serves as a deep acceptor, and it can be introduced by lowering the temperature in growth conditions.

When C (carbon) is used as the deep acceptor level, it is known that for example, a level is formed which is 0.9 eV away from the energy level $E_V$ of the upper end (top) of the valence band of the electron transit layer 14.

Although as an impurity acting as an acceptor for GaN which forms the electron transit layer 14, Mg (magnesium) is generally used, it is known that Mg forms a level which is 0.1 to 0.2 eV away from $E_V$. Since this is in a position 0.025 eV or more away from the energy level $E_V$ of the upper end (top) of the valence band of the electron transit layer 14 described above, it can be said to be a deep acceptor but it is not preferable due to the following reasons.

Specifically, when the Fermi level is fixed to the level of Mg, the probability of existence of holes at $E_V$ at room temperature is 0.003 to 0.02, that is, holes are produced at $E_V$ at room temperature at a rate of about 1/100 to 1/1000. As described above, when holes capable of moving freely are present within the electron transit layer 14, since a pn junction is produced in the electron transit layer 14, a parasitic capacitance is disadvantageously produced. Furthermore, the produced holes act as carriers, and thus a leak current is increased.

Hence, an impurity is preferable in which the deep acceptor level is in a position 0.2 eV or more away from $E_V$, for example, in a position 0.3 eV or more away therefrom.

In the present preferred embodiment, the concentrations of the impurities (dopants) which form the shallow donor level $E_D$, the deep donor level $E_{DD}$, the shallow acceptor level $E_A$ and the deep acceptor level $E_{DA}$ described above are respectively referred to as a shallow donor concentration $N_D$, a deep donor concentration $N_{DD}$, a shallow acceptor concentration $N_A$ and a deep acceptor concentration $N_{DA}$. For example, when as an impurity forms the deep acceptor level $E_{DA}$, the electron transit layer 14 is doped with only C (carbon) having a concentration of $1.0 \times 10^{16}$ cm$^{-3}$, the carbon concentration is defined as the deep acceptor concentration $N_{DA}$. These concentrations $N_D$, $N_{DD}$, $N_A$ and $N_{DA}$ can be measured by, for example, SIMS (Secondary Ion Mass Spectrometry).

In the preferred embodiment, as will be described later, as a factor which affects the gate threshold voltage Vth, $N_{DA} + N_A - N_{DD} - N_D$ is illustrated. $N_{DA} + N_A - N_{DD} - N_D$ can be measured with reference to, for example, FIGS. 3A to 3C.

A GaN layer (thickness W) in which electrodes are formed on the front and back surfaces is considered as a model structure of the electron transit layer 14. As shown in FIG. 3A, when no voltage is applied between both the electrodes (at the time of no bias), the acceptor $E_A$ and the deep acceptor $E_{DA}$ capture electrons discharged by the donor $E_D$ and the deep donor $E_{DD}$. Here, since the number of positive charges caused by the donor $E_D$ and the deep donor $E_{DD}$ discharging electrons is equal to the number of negative charges caused by the acceptor $E_A$ and the deep acceptor $E_{DA}$ capturing electrons, the GaN layer as a whole is electrically neutral.

Then, as shown in FIG. 3B, as a voltage V is applied, on a positive bias side, electrons are captured from the valence band ($E_V$) to the deep acceptor $E_{DA}$, with the result that negative charging is performed. Since an electric flux generated by the application of the voltage is cancelled out by the negatively charged region, electrons are not injected into the conduction band $E_c$ of the electron transit layer, and an extremely small amount of current flows.

Then, as shown in FIG. 3C, when a certain amount or more of voltage V is applied, electrons are captured by the deep acceptor $E_{DA}$ in all the regions. Even when a voltage exceeding this voltage is applied, no electrons are captured, and the flux is not sufficiently cancelled out, with the result that electrons are injected from one electrode into the conduction band $E_c$ and thus a current starts to flow. A formula which includes the voltage V at this time is derived from Poisson's equation into $N_{DA} + N_A - N_{DD} - N_D = 2V\varepsilon_0\varepsilon/qW^2$. In the equation, $\varepsilon_0$ represents a vacuum permittivity, and $\varepsilon$ represents the relative permittivity of the GaN layer.

The impurity concentration of the electron transit layer 14 as a whole preferably satisfies $N_{DA} + N_A - N_{DD} - N_D > 0$. The inequality means that as compared with the total sum ($N_D + N_{DD}$) of the impurity concentrations of donor atoms which can discharge electrons, the total sum ($N_A + N_{DA}$) of the impurity concentrations of acceptor atoms which can capture the discharged electrons is large. In other words, since in the electron transit layer 14, almost all of the electrons discharged from the shallow donor level and the deep donor level are not excited by the conduction band and are captured by the shallow acceptor level or the deep acceptor level, mainly by the deep acceptor level, the electron transit layer 14 is formed of a semi-insulating i-type GaN.

The electron supply layer 15 may have, in the interface with the electron transit layer 14, an AlN layer which has about a thickness of a few atoms (equal to or less than 5 nm, preferably 1 to 5 nm and more preferably 1 to 3 nm). The AlN layer described above reduces the scattering of alloys as seen in AlGaN, and thereby facilitates the enhancement of electron mobility.

The gate electrode 19 may be formed with a multilayer electrode film which has a lower layer in contact with the gate insulating film 16 and an upper layer stacked on the lower layer.

As the lower layer, for example, a metal having a work function $\Phi_M$ in a range of 4.2 eV to 5.0 eV can be selected as necessary according to the value of $N_{DA} + N_A - N_{DD} - N_D$ or the like which will be described later. Specifically, the lower layer may be formed of Ni ($\Phi_M$=4.8 eV), Pt ($\Phi_M$=5.0 eV), Mo ($\Phi_M$=4.3 eV), W ($\Phi_M$=4.6 eV) or TiN ($\Phi_M$=4.6 eV). On the other hand, the upper layer may be formed of Au or Al.

The gate electrode 19 is arranged so as to be displaced to the source electrode 17, and thereby has an asymmetric structure in which the distance between the gate and the drain is longer than the distance between the gate and the source. The asymmetric structure alleviates a high electric field produced between the gate and the drain to facilitate the enhancement of the withstand voltage.

The gate electrode 19 includes a gate main body portion 191 which enters a concave portion 162a formed in the second insulating layer 162 between the source electrode 17 and the drain electrode 18 and a field plate portion 192 which is continuous to the gate main body portion 191 and which is extended on the gate insulating film 16 outside the opening 161a toward the drain electrode 18. A distance $L_{fp}$ from a drain end 191a which is an end portion on the side of the drain electrode 18 in the interface between the gate main body portion 191 and the second insulating layer 162 to an end portion of the field plate portion 192 on the side of the drain electrode 18 is referred to as a field plate length. On the other hand, a distance $L_g$ from the drain end 191a in the interface between the gate main body portion 191 and the second insulating layer 162 to a source end 191b which is an end portion on the side of the source electrode 17 is referred to as a gate length. In other words, the width of an effective gate area (region within the concave portion 162a) which is a contact area between the gate electrode 19 and the bottom surface of the concave portion 162a of the second insulating layer 162 is referred to as the gate length. Furthermore, in the present specification, a distance between the gate main body portion 191 and the drain electrode 18 is represented by $L_{gd}$.

The field plate length $L_{fp}$ is preferably equal to or more than one tenth but equal to or less than one half of the distance $L_{gd}$ between the gate and the drain. Specifically, it may be equal to or more than 0.1 μm but equal to or less than 0.5 μm. On the other hand, the gate length $L_g$ is preferably equal to or more than 0.1 μm but equal to or less than 1.0 μm. Specifically, it may be equal to or more than 0.2 μm but equal to or less than 0.5 μm.

The source electrode 17 and the drain electrode 18 are, for example, ohmic electrodes which include Ti and Al, and are electrically connected via the electron supply layer 15 to the two-dimensional electron gas 20.

The bonding wires 9 to 11 shown in FIG. 1 are connected to the drain electrode 18, the source electrode 17 and the gate electrode 19, respectively. On the back surface of the substrate 12, a back surface electrode 21 is formed, and the substrate 12 is connected via the back surface electrode 21 to the base portion 5. Hence, in the present preferred embodiment, the substrate 12 is electrically connected via the bonding wire 9 to the drain electrode 18 so as to have a drain potential.

In the nitride semiconductor device 3, on the electron transit layer 14, the electron supply layer 15 having a different Al composition is formed so as to form a heterojunction. In this way, within the electron transit layer 14 in the vicinity of the interface between the electron transit layer 14 and the electron supply layer 15, the two-dimensional electron gas 20 is formed, and a HEMT which utilizes the two-dimensional electron gas 20 as a channel is formed. The gate electrode 19 is opposite to the electron transit layer 14 through the gate insulating film 16, and the electron supply layer 15 is not present immediately below the gate electrode 19 (the gate main body portion 191). Hence, immediately below the gate electrode 19, the two-dimensional electron gas 20 resulting from polarization caused by the lattice mismatch between the electron supply layer 15 and the electron transit layer 14 is not formed. Thus, when no bias is applied to the gate electrode 19 (at the time of zero bias), a channel produced by the two-dimensional electron gas 20 is interrupted immediately below the gate electrode 19. In this way, a normally-off type HEMT is realized.

In use, for example, between the source electrode 17 and the drain electrode 18, a predetermined voltage (for example, 200 V to 600 V) in which the side of the drain electrode 18 is positive is applied. In this state, an on-voltage which is a positive value with respect to a reference potential (0 V) of the source electrode 17 is applied to the gate electrode 19. In this way, a channel is induced within the electron transit layer 14 immediately below the gate electrode 19, and the two-dimensional electron gas 20 on both sides of the gate electrode 19 is connected. In this way, a conduction is achieved between the source and the drain.

Here, a mechanism in which a current flows between the source and the drain will be specifically described with reference to FIGS. 4A to 4C. A description will be given below with the assumption that the electron transit layer 14 is a semi-insulating i-type GaN layer.

Figure 4A:
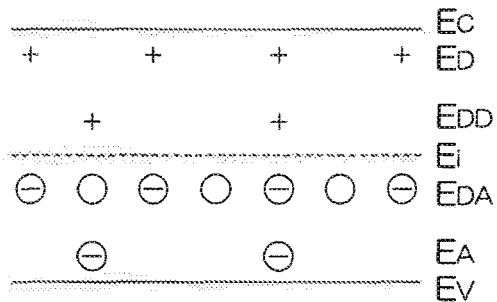
FIGS. 4A to 4C are energy band diagrams showing, with time, the movement of electrons until a current starts to flow.

First, in the state of no bias, as shown in FIG. 4A, the semi-insulating GaN layer is a layer in which electrons supplied from the donor $E_D$ and the deep donor $E_{DD}$ are mainly compensated for by the deep acceptor $E_{DA}$ (the acceptor $E_A$ also facilitates the compensation for the electrons), and a positive charge density caused by the ionized donor is equal to a negative charge density caused by the ionized acceptor, with the result that the semi-insulating GaN layer is electrically neutral. Here, the Fermi level of the semi-insulating GaN layer is fixed to the vicinity of the deep acceptor level. The deep acceptor level of the semi-insulating GaN forms a deep acceptor level in the vicinity of $E_{DA}=2.4$ eV in many cases such as a case where the vacancy defect of, for example, carbon or Ga is introduced.

Figure 4B:
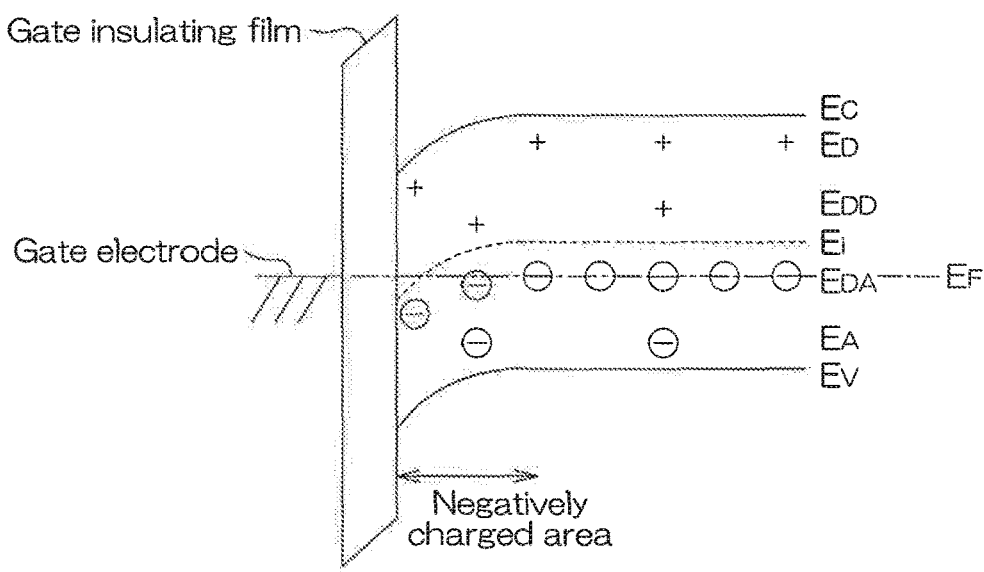

Then, as shown in FIG. 4B, a junction is formed such that when the gate insulating film and the gate electrode are formed on the semi-insulating GaN layer, the Fermi levels $E_F$ thereof are equal to each other. In general, the work function of a metal is 4.0 to 5.0 eV, and the Fermi level $E_F$ fixed to the deep acceptor level $E_{DA}$ of GaN is in the vicinity of 1.0 eV (6.0 eV from a vacuum level) from the valence band. Hence, when the gate voltage Vg=0V, a built-in potential of 1 to 2V is formed between the gate electrode and the semi-insulating GaN layer. Since even when Vg=0V, such a potential distribution that a positive bias is applied to the gate electrode is formed by the built-in potential, holes are discharged from the deep acceptor on the side of the gate insulating film in the semi-insulating GaN layer, and in a region where the holes are discharged, the negative charge density of the ionized acceptor is higher than the positive charge density of the ionized donor, with the result that the total charge density is $N_{DA}+N_A-N_{DD}-N_D$. In a case where the gate insulating film is thin, the permittivity of the gate insulating film is high and the value of $N_{DA}+N_A-N_{DD}-N_D$ is small, when the equation of Vg=0V holds true by the potential, in a GaN/gate insulating film interface, a state where the Fermi level $E_F$ of GaN exceeds an intrinsic Fermi level $E_i$ (bandgap center), that is, a "weak inversion" is achieved, with the result that an incomplete normally-off state where a small current flows between the source and the drain is achieved. It is necessary to increase the thickness of the gate insulating film or increase $N_{DA}+N_A-N_{DD}-N_D$ such that when Vg=0V, a complete normally-off state where the Fermi level $E_F$ of GaN does not exceed the intrinsic Fermi level $E_i$ is achieved.

Figure 4C:
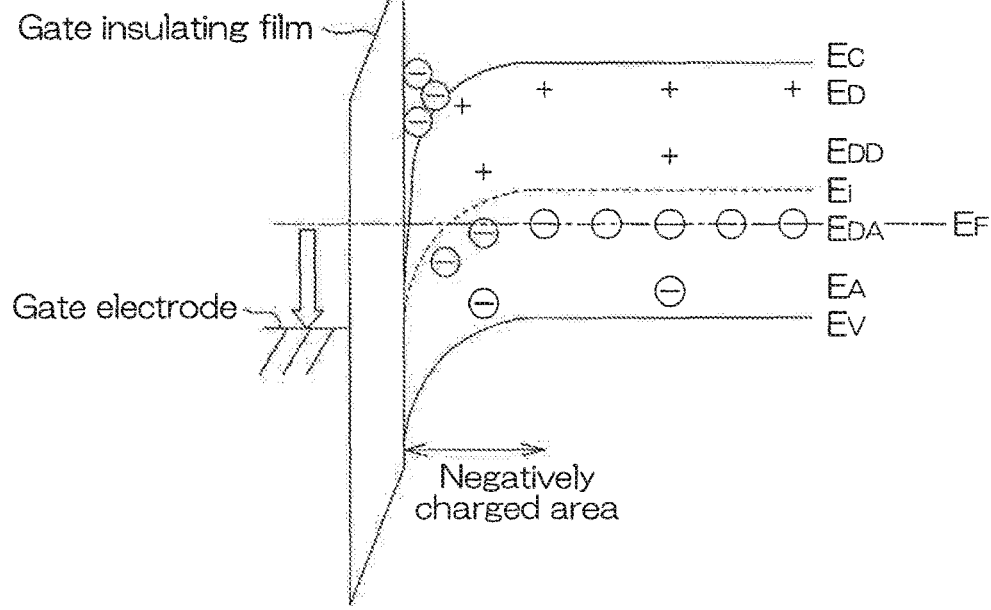

Then, as shown in FIG. 4C, when the gate voltage is applied, holes are discharged in a wider area, and when a certain gate voltage is applied, the Fermi level $E_F$ in the GaN/gate insulating film interface exceeds the conduction band $E_c$. When a gate voltage exceeding this voltage is applied, an electron density in the GaN/gate interface is increased exponentially. Here, as the thickness of the gate insulating film is decreased, and the permittivity of the gate insulating film is increased, a rate of increase in the electron density to the gate voltage is increased, and the rate of increase in the electron density does not depend on $N_{DA}+N_A-N_{DD}-N_D$ in the semi-insulating GaN layer.

Hence, when the thickness of the gate insulating film is increased or the permittivity is decreased, the complete normally-off state can be achieved but as a tradeoff, a drive gate voltage is increased. By contrast, the deep acceptor is actively introduced, and $N_{DA}+N_A-N_{DD}-N_D$ is increased, and thus while it is maintained that the gate insulating film is thin and that the permittivity is high, the complete normally-off state can be achieved, with the result that it is possible to achieve a high mutual conductance gm and to decrease the drive gate voltage.

Figure 5A:
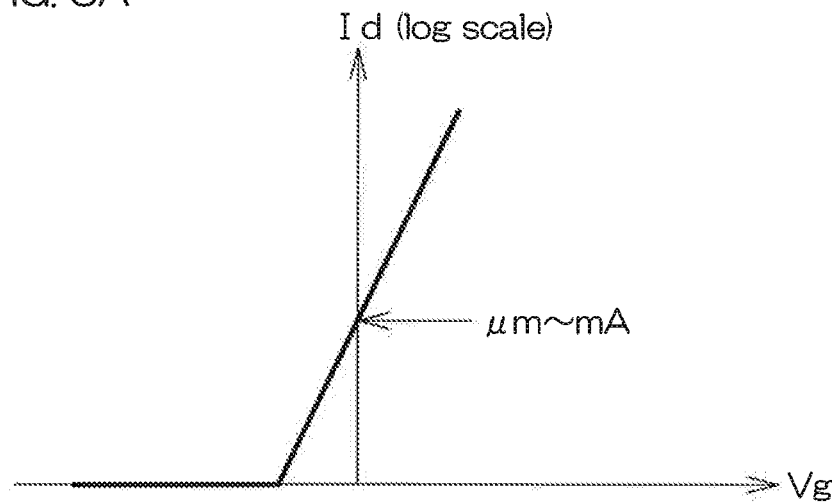
FIG. 5A is a diagram showing the Id-Vg characteristic of a conventional GaN-HEMT.
Figure 5B:
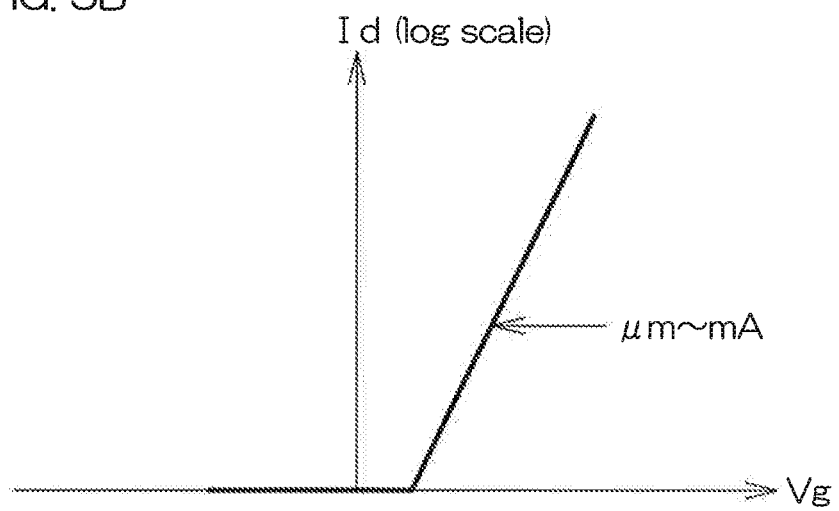
FIG. 5B is a diagram showing the Id-Vg characteristic of a GaN-HEMT according to the preferred embodiment of the present invention.

Although as described above, at the time of no bias (the gate application voltage Vg=0V), no current ideally flows, it is found from research by the inventors of the present application that even at the time of no bias, a weak inversion occurs. In other words, as in a relationship (Id-Vg characteristic) between the gate application voltage Vg and the drain current Id shown in FIG. 5A, when the gate application voltage Vg=0V, a small current Id flows. Hence, the inventors of the present application provides, with the following method, a normally-off type HEMT in which as shown in FIG. 5B, at the time of no bias, a weak inversion is not started and that a low drive gate voltage is used.

More specifically, the conditions of $N_{DA}+N_A-N_{DD}-N_D$ have been examined such that in a region of the gate application voltage Vg≤0V, a weak inversion is prevented from being started, that is, the gate threshold voltage Vth>0. Conditions under which Formula (1) is satisfied have been examined.

$$V\text{th}=\Psi_S-(E+E_F-\Psi_M)>0 \quad (1)$$

(where $\Psi_S$ represents the potential (surface potential) of an interface between the gate electrode 19 and the gate insulating film 16, E represents the electron affinity of the electron transit layer 14, $E_F$ represents the Fermi level (with reference to the energy level $E_c$ of the lower end (bottom) of the conduction band) of the semi-insulating GaN and $\Phi_M$ represents the work function of the gate electrode 19).

Figure 6A:
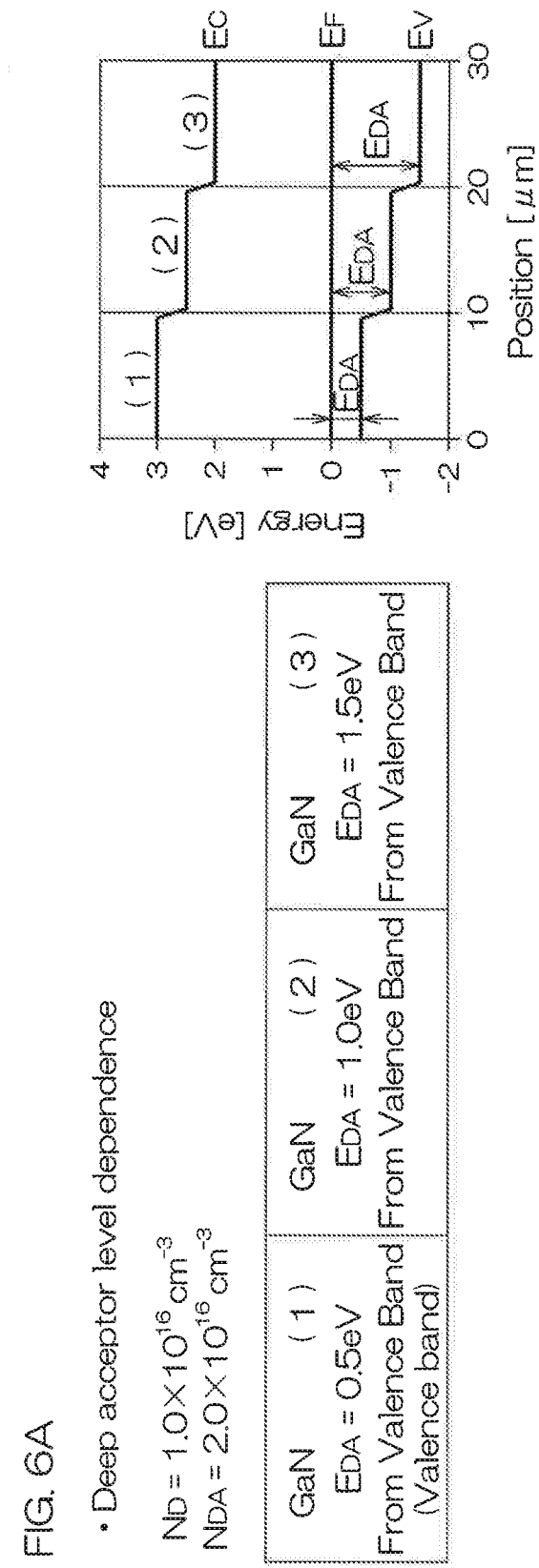
FIG. 6A is a diagram showing the dependence of the Fermi level $E_F$ of a semi-insulating GaN on a deep acceptor level $E_{DA}$.

First, Formula (1) indicates that the Fermi level $E_F$ of the semi-insulating GaN can be replaced with the deep acceptor level $E_{DA}$ of the electron transit layer 14 (the semi-insulating GaN). FIG. 6A is a diagram showing the dependence of the Fermi level $E_F$ of the semi-insulating GaN on the deep acceptor level $E_{DA}$, and FIG. 6B a diagram showing the dependence of the Fermi level $E_F$ of the semi-insulating GaN on the deep acceptor level $E_{DA}$. In FIGS. 6A and 6B, the dependence is indicated with reference to the deep acceptor level $E_{DA}$.

In FIG. 6A, under conditions in which the donor concentration $N_D=1.0\times10^{16}$ cm$^{-3}$ (constant) and the deep acceptor concentration $N_{DA}=2.0\times10^{16}$ cm$^{-3}$ (constant), the Fermi level $E_F$ of the semi-insulating GaN agrees with the deep acceptor level $E_{DA}=0.5$ eV with reference to the valence band, and in either case of 1.0 eV and 1.5 eV, the Fermi level $E_F$ of the semi-insulating GaN agrees with the deep acceptor level $E_{DA}$.

On the other hand, in FIG. 6B, under conditions in which the donor concentration $N_D=1.0\times10^{16}$ cm$^{-3}$ (constant) and the deep acceptor level $E_{DA}=1.0$ eV (constant), in any one of the cases of the deep donor concentration $N_{DA}=2.0\times10^{16}$ cm$^{-3}$, the deep donor concentration $N_{DA}=4.0\times10^{16}$ cm$^{-3}$ and the deep donor concentration $N_{DA}=2.0\times10^{17}$ cm$^{-3}$, the Fermi level $E_F$ of the semi-insulating GaN is constant.

Figure 7:
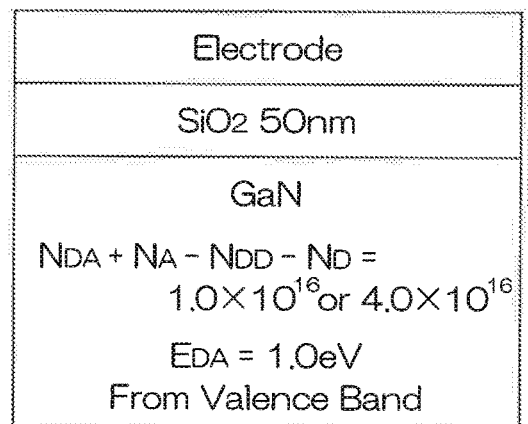
FIG. 7 is a schematic view of a model structure used for a simulation.
Figure 8:
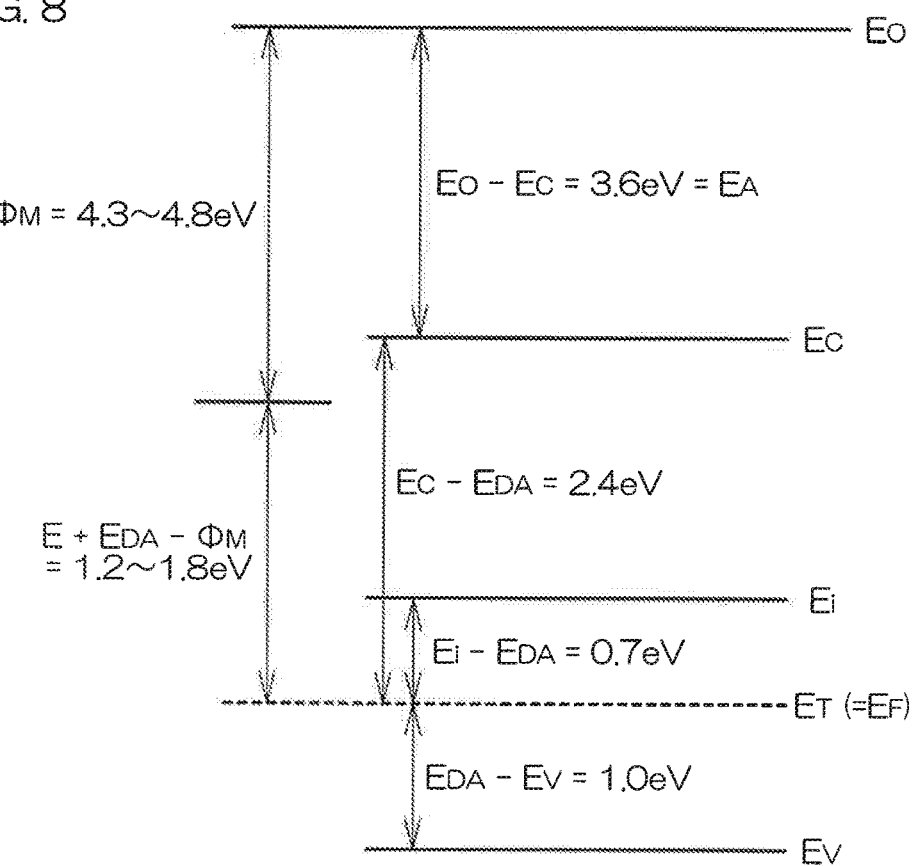
FIG. 8 is an energy band diagram in the simulation.

FIGS. 7 to 10 are diagrams for illustrating an influence on the gate threshold voltage Vth provided by $N_{DA}+N_A-N_{DD}-N_D$ in the semi-insulating GaN. More specifically, FIG. 7 is a schematic view of a model structure used for a simulation. FIG. 8 is an energy band diagram in the simulation. In FIG. 8, $E_0$ represents the vacuum level, and $E_i$ represents the intrinsic Fermi level.

As shown in FIGS. 7 and 8, the conditions of the semi-insulating GaN in the model structure are set as follows, and the potential, the charge density (negative charge density) and the magnitude of an electric field when a weak inversion and a strong inversion occur in GaN are individually determined by simulations. The results are shown in FIGS. 9A to 9C and FIGS. 10A to 10C. In FIGS. 9A to 9C and FIGS. 10A to 10C, the vertical axis represents a potential with reference to the Fermi level of the semi-insulating GaN, and the horizontal axis (position) represents a depth with reference to an interface (the surface of SiO$_2$) between SiO$_2$ and an electrode. The position of 50 nm means the interface between the gate electrode and the semi-insulating GaN, and in the state of a weak inversion, the potential of this position is 0.7 eV which corresponds to $E_i$-$E_{DA}$, and in the state of a strong inversion, the potential of this position is 2.4 eV which corresponds to $E_C$-$E_{DA}$.

<Simulation Conditions>
$N_{DA}+N_A-N_{DD}-N_D$ in GaN (the electron transit layer 14)=$1.0\times10^{16}$ cm$^{-3}$ or $4.0\times10^{16}$ cm$^{-3}$
The deep acceptor level $E_{DA}$ in GaN (the electron transit layer 14)=2.4 eV (with reference to $E_c$)
The thickness of SiO$_2$ (the gate insulating film 16): 50 nm
The electron affinity E ($E_0$-$E_c$) of GaN=3.6 eV
The work function $\Phi_M$ of the electrode=4.3 to 4.8 eV It is found from FIGS. 9A to 9C and FIGS. 10A to 10C that as compared with the case where $N_{DA}+N_A-N_{DD}-N_D=1.0\times10^{16}$ cm$^{-3}$, in the case where $N_{DA}+N_A-N_{DD}-N_D=4.0\times10^{16}$ cm$^{-3}$, the potential on the surface of SiO$_2$ (the surface potential $\Psi_S$ in Formula (1') above) is high. The former surface potential $\Psi_S$ in the state of a weak inversion is 1.3 eV whereas the latter surface potential $\Psi_S$ is 1.8 eV. In other words, when Mo ($\Phi_M$=4.3 eV) is used for the gate electrode, under the former conditions of $N_{DA}+N_A-N_{DD}-N_D=1.0\times10^{16}$ cm$^{-3}$, the above Formula (1') of $\Psi_S-(E_A+E_{DA}-\Phi_M)$=1.3−(3.6+2.4−4.3)=−0.4 eV holds true, and when the gate application voltage Vg is equal to or more than −0.4V, a weak inversion occurs. This means that even when no gate application voltage Vg is applied, a small current flows by a weak inversion, and a normally-off state is not achieved. By contrast, under the latter conditions, the above Formula (1') of $\Psi_S-(E_A+E_{DA}-\Phi_M)$=1.8−(3.6+2.4−4.3)=0.1 eV holds true, and this means that when the gate voltage is 0V, the state of a weak inversion is not achieved, and a normally-off state is achieved. Consequently, it is found that the value of $N_{DA}+N_A-N_{DD}-N_D$ is adjusted according to the electron affinity E and the deep acceptor level $E_{DA}$ of the electron transit layer 14, the film thickness of SiO$_2$ and the work function $\Phi_M$ of the electrode to increase the surface potential $\Psi_S$, and thus it is possible to make an inequality of the gate threshold voltage Vth>0 hold true.

Next, under conditions indicated in Tables 1 and 2 below, simulations are performed, and thus the relationship between $N_{DA}+N_A-N_{DD}-N_D$ and the gate threshold voltage Vth is individually determined. The results are shown in Tables 1 and 2 and FIGS. 11 and 12.

Figure 10A:
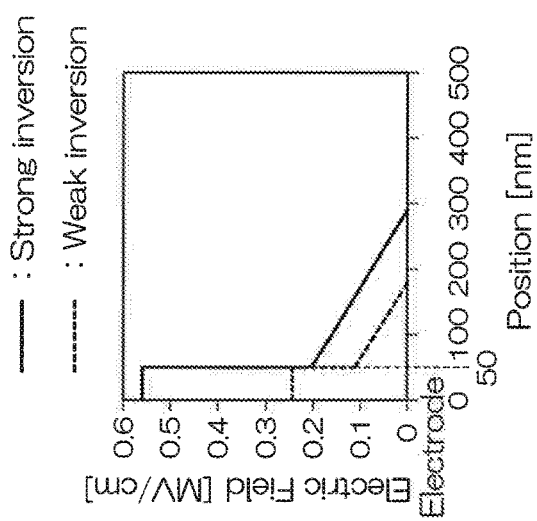
FIGS. 10A to 10C are diagrams showing the simulation results when $N_{DA}+N_A-N_{DD}-N_D=4.0\times10^{16}$ cm$^{-3}$.
Figure 10B:
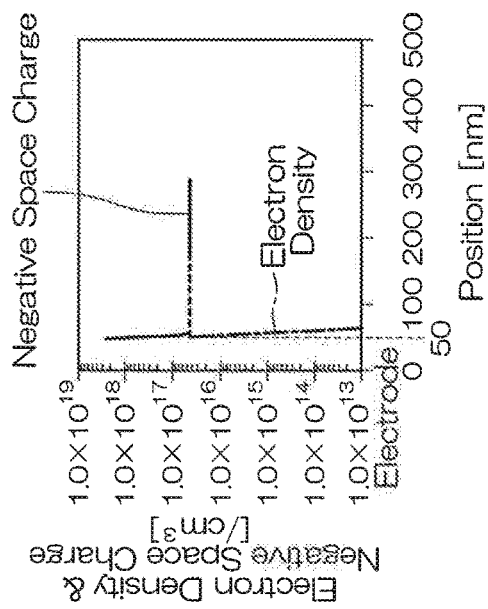
Figure 10C:
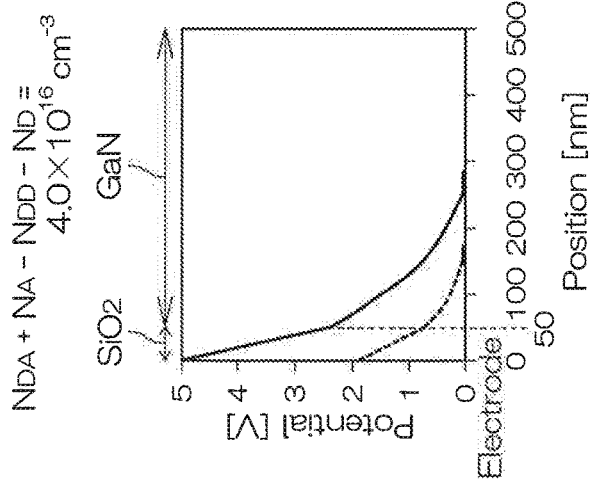
Figure 12:
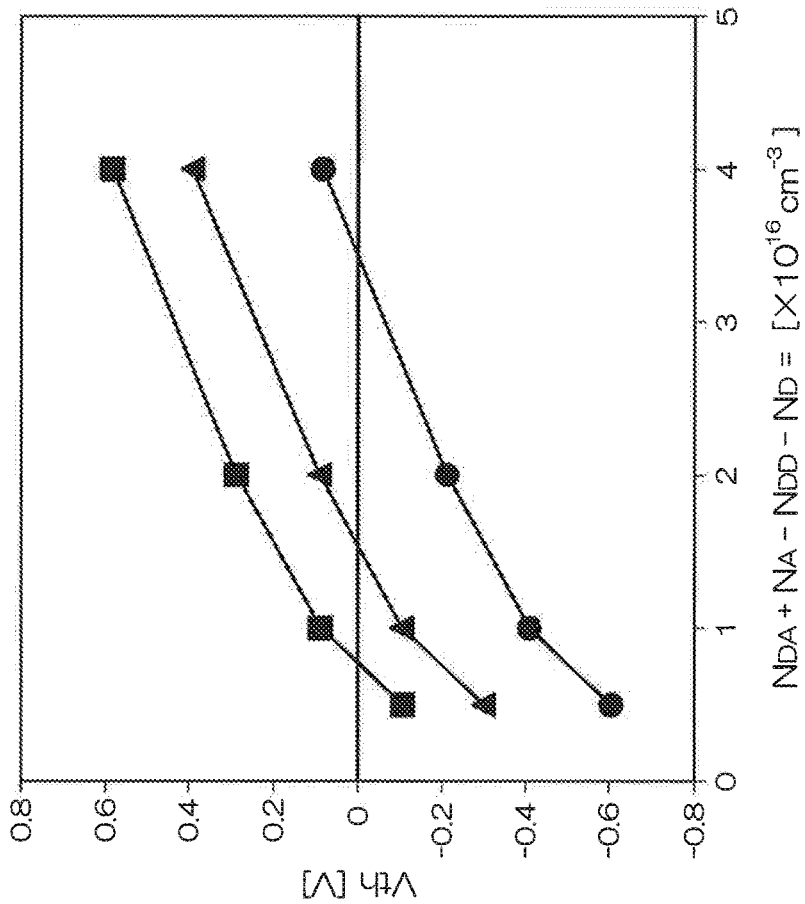
FIG. 12 is a graph showing a relationship between $N_{DA}+N_A-N_{DD}-N_D$ and a gate threshold voltage Vth.

It is found from Tables 1 and 2 and FIGS. 11 and 12 that a complete normally-off state is achieved under conditions in which the gate threshold voltage Vth is a positive value (>0). Hence, in order to achieve a complete normally-off state, for example, it is preferable to adjust, based on Tables 1 and 2 and FIGS. 11 and 12, the deep acceptor concentration $N_{DA}$ of GaN such that $N_{DA}+N_A-N_{DD}-N_D$ satisfies an equality of the gate threshold voltage Vth>0. A region into which the deep acceptor concentration is introduced can be designed based on FIGS. 9A to 9C and FIG. 10A to 10C. For example, in a case where $N_{DA}+N_A-N_{DD}-N_D=1.0\times10^{16}$ cm$^{-3}$ as shown in FIGS. 9A to 9C, a potential distribution in the state of a weak inversion is produced in a region whose depth is 300 nm or less, and thus $N_{DA}+N_A-N_{DD}-N_D$ in this region is preferably set equal to or more than $1.0\times10^{16}$ cm$^{-3}$. On the other hand, in a case where $N_{DA}+N_A-N_{DD}-N_D=4.0\times10^{16}$ cm$^{-3}$ as shown in FIGS. 10A to 10C, a potential distribution in the state of a weak inversion is produced in a region whose depth is 200 nm or less, and thus $N_{DA}+N_A-N_{DD}-N_D$ in this region is preferably set equal to or more than $4.0\times10^{16}$ cm$^{-3}$.

The above description will be summarized below. As shown in FIG. 12, in a range where the work function $\Phi_M$ of the gate electrode 19 is relatively high (for example, more than 4.5 eV but equal to or less than 5.0 eV), depending on the magnitudes of the electron affinity E and the deep acceptor level $N_{DA}$ of the electron transit layer 14 (the semi-insulating GaN in the above description), when $N_{DA}+N_A-N_{DD}-N_D$ is substantially equal to or more than $1.0\times10^{16}$ cm$^{-3}$, it is possible to make the equality of the gate threshold voltage Vth>0 hold true. On the other hand, in a range where the work function $\Phi_M$ of the gate electrode 19 is relatively low (for example, equal to or more than 4.0 eV but equal to or less than 4.5 eV), depending on the magnitudes of the electron affinity E and the deep acceptor level $N_{DA}$ of the electron transit layer 14 (the semi-insulating GaN in the above description), $N_{DA}+N_A-N_{DD}-N_D$ is preferably substantially equal to or more than $3.0\times10^{16}$ cm$^{-3}$.

It is found by comparison of FIGS. 11 and 12 that even when the thickness of SiO$_2$ is halved (100 nm→50 nm), $N_{DA}+N_A-N_{DD}-N_D$ is appropriately designed, and thus it is possible to make the equality of the gate threshold voltage Vth>0 hold true. Hence, the gate insulating film 16 (SiO$_2$ in the above description) is reduced in thickness, and thus it is possible to reduce the influence on a high-speed operation.

TABLE 1

E = 3.6 eV
$E_{DA}$ (from $E_C$) = 2.4
$SiO_2$ = 100 nm

| | | $\Phi_M$ | 4.3 | 4.6 | 4.8 |
|---|---|---|---|---|---|
| | | $E + E_{DA} - \Phi_M$ | 1.7 | 1.4 | 1.2 |
| | | $\Psi_S$ | | | |
| $N_{DA} + N_A - N_{DD} - N_D$ | 0.5 | 1.5 | −0.2 | 0.1 | 0.3 |
| ($\times 10^{16}$ cm$^{-3}$) | 1 | 1.9 | 0.2 | 0.5 | 0.7 |
| | 2 | 2.4 | 0.7 | 1 | 1.2 |
| | 4 | 3.1 | 1.4 | 1.7 | 1.9 |
| | | | | Vth = ($\Psi_S$ − | |
| | | | | ($E + E_{DA} - \Phi_M$)) | |

TABLE 2

E = 3.6 eV
$E_{DA}$ (from $E_C$) = 2.4
$SiO_2$ = 50 nm

| | | $\Phi_M$ | 4.3 | 4.6 | 4.8 |
|---|---|---|---|---|---|
| | | $E + E_{DA} - \Phi_M$ | 1.7 | 1.4 | 1.2 |
| | | $\Psi_S$ | | | |
| $N_{DA} + N_A - N_{DD} - N_D$ | 0.5 | 1.1 | −0.6 | −0.3 | −0.1 |
| ($\times 10^{16}$ cm$^{-3}$) | 1 | 1.3 | −0.4 | −0.1 | 0.1 |
| | 2 | 1.5 | −0.2 | 0.1 | 0.3 |
| | 4 | 1.8 | 0.1 | 0.4 | 0.6 |
| | | | | Vth = ($\Psi_S$ − | |
| | | | | ($E + E_{DA} - \Phi_M$)) | |

Although the preferred embodiment of the present invention is described above, the present invention can be practiced in other preferred embodiments.

For example, although in the preferred embodiment described above, the example where the electron transit layer 14 is formed with the GaN layer and the electron supply layer 15 is formed of AlGaN is described, as long as the electron transit layer 14 and the electron supply layer 15 differ from each other in the Al composition, other combinations are also possible. The combination between the electron supply layer and the electron transit layer may be any one of AlGaN layer/GaN layer, AlGaN layer/AlGaN layer (where the Al composition is different), AlInN layer/AlGaN layer, AlInN layer/GaN layer, AlN layer/GaN layer and AlN layer/AlGaN layer. More generally, the electron supply layer contains Al and N in its composition. The electron transit layer contains Ga and N in its composition, and has an Al composition different from the electron supply layer. The electron supply layer differs from electron transit layer in the Al composition, and a lattice mismatch thus occurs therebetween, with the result that a carrier caused by polarization contributes to the formation of the two-dimensional electron gas.

Although in the preferred embodiment described above, the example where the electron supply layer 15 is removed and the gate insulating film 16 is in contact with the surface of the electron transit layer is described, in the nitride semiconductor layer on the substrate 12, the electron supply layer 15 may be left with the gate insulating film 16 without being etched, and the electron supply layer may be prevented from being inactivated by any method such as oxidation.

Although in the preferred embodiment described above, as an example of the material of the substrate 12, silicon is used, an arbitrary substrate material such as a sapphire substrate or a GaN substrate can be applied.

Various design modifications are possible within a range described in the scope of claims.

What is claimed is:

1. A nitride semiconductor device comprising:
   a first conductive member;
   a second conductive member disposed away from the first conductive member;
   a third conductive member disposed at an opposite side of the second conductive member with respect to the first conductive member such that the third conductive member is away from the first conductive member;
   a nitride semiconductor layer disposed on the first conductive member, the nitride semiconductor layer including an electron transit layer and an electron supply layer which is in contact with the electron transit layer and which has a composition different from a composition of the electron transit layer;
   a gate insulating film formed on the nitride semiconductor layer;
   a drain electrode formed on the nitride semiconductor layer, the drain electrode electrically connected to the nitride semiconductor layer and electrically connected to the first conductive member via a first wire;
   a gate electrode formed on the gate insulating film, the gate electrode electrically connected to the second conductive member via a second wire;
   a source electrode formed on the nitride semiconductor layer, the source electrode electrically connected to the nitride semiconductor layer and electrically connected to the third conductive member via a third wire; and
   a back surface electrode formed on a back surface of the nitride semiconductor layer such that the back surface electrode is in contact with the first conductive member,
   wherein a region whose depth is 250 nm from an interface between the gate insulating film and the gate electrode includes a region which has a deep acceptor concentration equal to or more than $1.0 \times 10^{16}$ cm$^{-3}$,
   the second wire is longer than the first wire, and
   the nitride semiconductor layer is electrically connected to the drain electrode via the back surface electrode, the first conductive member and the first wire such that the nitride semiconductor layer has a drain potential.

2. The nitride semiconductor device according to claim 1, wherein the region whose depth is 250 nm includes a region in which a value of $N_{DA}+N_A-N_{DD}-N_D$ is equal to or more than $1.0 \times 10^{16}$ cm$^{-3}$, and $N_A$ represents a shallow acceptor concentration, $N_{DA}$ represents a deep acceptor concentration, $N_D$ represents a shallow donor concentration and $N_{DD}$ represents a deep donor concentration.

3. The nitride semiconductor device according to claim 1, wherein the region whose depth is 250 nm includes a region in which a value of $N_{DA}-N_D-N_{DD}$ is equal to or more than $1.0 \times 10^{16}$ cm$^{-3}$, and $N_{DA}$ represents a deep acceptor concentration, $N_D$ represents a shallow donor concentration and $N_{DD}$ represents a deep donor concentration.

4. The nitride semiconductor device according to claim 1, wherein a work function $\Phi_M$ of the gate electrode is equal to or less than 5.0 eV.

5. The nitride semiconductor device according to claim 1, wherein a relationship between a thickness d (nm) of the gate insulating film and a relative permittivity ε of the gate insulating film is d/ε≤25.

6. The nitride semiconductor device according to claim 1, wherein the deep acceptor concentration is equal to or less than $5.0 \times 10^{16}$ cm$^{-3}$.

7. The nitride semiconductor device according to claim 1, wherein the deep acceptor includes an energy level in a position 0.025 eV or more away from an energy level of an upper end of a valence band of the electron transit layer.

8. The nitride semiconductor device according to claim 1, wherein the deep acceptor includes an energy level in a position more than 0.2 eV away from an energy level of an upper end of a valence band of the electron transit layer.

9. The nitride semiconductor device according to claim 1, wherein the deep acceptor concentration includes a carbon concentration and a vacancy defect concentration of Ga atoms.

10. The nitride semiconductor device according to claim 1, wherein the first wire is connected to the drain electrode between the nitride semiconductor layer and the second wire in a thickness direction of the nitride semiconductor layer.

11. The nitride semiconductor device according to claim 10, wherein the nitride semiconductor layer has a first side and a second side which are opposed to each other,
the first wire is crossed over the first side of the nitride semiconductor layer and connected to the drain electrode, and
the third wire is crossed over the second side of the nitride semiconductor layer and connected to the source electrode.

12. The nitride semiconductor device according to claim 11, wherein a top portion of the second wire is higher than a top portion of the first wire in the thickness direction of the nitride semiconductor layer.

13. The nitride semiconductor device according to claim 12, wherein a top portion of the third wire is positioned between the top portion of the first wire and the top portion of the second wire in the thickness direction of the nitride semiconductor layer.

14. The electronic component according to claim 1, wherein the first wire is connected to the drain electrode between the nitride semiconductor and the second wire in a thickness direction of the nitride semiconductor.

15. The electronic component according to claim 14, wherein
the nitride semiconductor has a first side and a second side which are opposed to each other,
the first wire is crossed over the first side of the nitride semiconductor and connected to the drain electrode, and
the third wire is crossed over the second side of the nitride semiconductor and connected to the source electrode.

16. The electronic component according to claim 15, wherein a top portion of the second wire is higher than a top portion of the first wire in the thickness direction of the nitride semiconductor.

17. The electronic component according to claim 16, wherein a top portion of the third wire is positioned between the top portion of the first wire and the top portion of the second wire in the thickness direction of the nitride semiconductor.

18. A nitride semiconductor device comprising:
a first conductive member;
a second conductive member disposed away from the first conductive member;
a third conductive member disposed at an opposite side of the second conductive member with respect to the first conductive member such that the third conductive member is away from the first conductive member;
a nitride semiconductor layer disposed on the first conductive member, the nitride semiconductor layer including an electron transit layer and an electron supply layer which is in contact with the electron transit layer and which has a composition different from a composition of the electron transit layer;
a gate insulating film formed on the nitride semiconductor layer;
a drain electrode formed on the nitride semiconductor layer, the drain electrode electrically connected to the nitride semiconductor layer and electrically connected to the first conductive member via a first wire;
a gate electrode formed on the gate insulating film, the gate electrode electrically connected to the second conductive member via a second wire;
a source electrode formed on the nitride semiconductor layer, the source electrode electrically connected to the nitride semiconductor layer and electrically connected to the third conductive member via a third wire; and
a back surface electrode formed on a back surface of the nitride semiconductor layer such that the back surface electrode is in contact with the first conductive member,
wherein a region whose depth is 250 nm from an interface between the gate insulating film and the gate electrode includes a region which has a carbon concentration equal to or more than $1.0 \times 10^{16}$ cm$^{-3}$,
the second wire is longer than the first wire, and
the nitride semiconductor layer is electrically connected to the drain electrode via the back surface electrode, the first conductive member and the first wire such that the nitride semiconductor layer has a drain potential.

19. A nitride semiconductor device comprising:
a first conductive member;
a second conductive member disposed away from the first conductive member;
a third conductive member disposed at an opposite side of the second conductive member with respect to the first conductive member such that the third conductive member is away from the first conductive member;
a nitride semiconductor layer disposed on the first conductive member, the nitride semiconductor layer including an electron transit layer and an electron supply layer which is in contact with the electron transit layer and which has a composition different from a composition of the electron transit layer;
a gate insulating film formed on the nitride semiconductor layer;
a drain electrode formed on the nitride semiconductor layer, the drain electrode electrically connected to the nitride semiconductor layer and electrically connected to the first conductive member via a first wire;
a gate electrode formed on the gate insulating film, the gate electrode electrically connected to the second conductive member via a second wire;
a source electrode formed on the nitride semiconductor layer, the source electrode electrically connected to the nitride semiconductor layer and electrically connected to the third conductive member via a third wire; and
a back surface electrode formed on a back surface of the nitride semiconductor layer such that the back surface electrode is in contact with the first conductive member,
wherein a region whose depth is 150 nm from an interface between the gate insulating film and the gate electrode includes a region which has a deep acceptor concentration equal to or more than $3.0\times10^{16}$ cm$^{-3}$, the second wire is longer than the first wire, and the nitride semiconductor layer is electrically connected to the drain electrode via the back surface electrode, the first conductive member and the first wire such that the nitride semiconductor layer has a drain potential.

20. The nitride semiconductor device according to claim 19, wherein the region whose depth is 150 nm includes a region in which a value of $N_{DA}+N_A-N_{DD}-N_D$ is equal to or more than $3.0\times10^{16}$ cm$^{-3}$, and $N_A$ represents a shallow acceptor concentration, $N_{DA}$ represents a deep acceptor concentration, $N_D$ represents a shallow donor concentration and $N_{DD}$ represents a deep donor concentration.

21. The nitride semiconductor device according to claim 19, wherein the region whose depth is 150 nm includes a region in which a value of $N_{DA}-N_D-N_{DD}$ is equal to or more than $3.0\times10^{16}$ cm$^{-3}$, and $N_{DA}$ represents a deep acceptor concentration, $N_D$ represents a shallow donor concentration and $N_{DD}$ represents a deep donor concentration.

22. The nitride semiconductor device according to claim 19, wherein a work function $\Phi_M$ of the gate electrode is equal to or less than 4.5 eV.

23. The nitride semiconductor device according to claim 19, wherein a relationship between a thickness d (nm) of the gate insulating film and a relative permittivity $\varepsilon$ of the gate insulating film is $d/\varepsilon \leq 25$.

24. A nitride semiconductor device comprising:

a first conductive member;

a second conductive member disposed away from the first conductive member;

a third conductive member disposed at an opposite side of the second conductive member with respect to the first conductive member such that the third conductive member is away from the first conductive member;

a nitride semiconductor layer disposed on the first conductive member, the nitride semiconductor layer including an electron transit layer and an electron supply layer which is in contact with the electron transit layer and which has a composition different from a composition of the electron transit layer;

a gate insulating film formed on the nitride semiconductor layer;

a drain electrode formed on the nitride semiconductor layer, the drain electrode electrically connected to the nitride semiconductor layer and electrically connected to the first conductive member via a first wire;

a gate electrode formed on the gate insulating film, the gate electrode electrically connected to the second conductive member via a second wire;

a source electrode formed on the nitride semiconductor layer, the source electrode electrically connected to the nitride semiconductor layer and electrically connected to the third conductive member via a third wire; and a back surface electrode formed on a back surface of the nitride semiconductor layer such that the back surface electrode is in contact with the first conductive member, wherein a region whose depth is 150 nm from an interface between the gate insulating film and the gate electrode includes a region which has a carbon concentration equal to or more than $3.0\times10^{16}$ cm$^{-3}$, the second wire is longer than the first wire, and the nitride semiconductor layer is electrically connected to the drain electrode via the back surface electrode, the first conductive member and the first wire such that the nitride semiconductor layer has a drain potential.

25. An electronic component comprising:

a first conductive member;

a second conductive member disposed away from the first conductive member;

a third conductive member disposed at an opposite side of the second conductive member with respect to the first conductive member such that the third conductive member is away from the first conductive member;

a nitride semiconductor disposed on the first conductive member;

a gate insulating layer formed on the nitride semiconductor;

a drain electrode formed on the nitride semiconductor, the drain electrode electrically connected to the nitride semiconductor and electrically connected to the first conductive member via a first wire;

a gate electrode formed on the gate insulating layer, the gate electrode electrically connected to the second conductive member via a second wire;

a source electrode formed on the nitride semiconductor, the source electrode electrically connected to the nitride semiconductor and electrically connected to the third conductive member via a third wire; and a back surface electrode formed on a back surface of the nitride semiconductor such that the back surface electrode is in contact with the first conductive member, wherein the second wire is longer than the first wire, and the nitride semiconductor is electrically connected to the drain electrode via the back surface electrode, the first conductive member and the first wire such that the nitride semiconductor has a drain potential.

* * * * *